(12) United States Patent
Habering et al.

(10) Patent No.: US 11,333,563 B2
(45) Date of Patent: May 17, 2022

(54) SYSTEM FOR POSITION AND/OR LINE MONITORING IN AN ENERGY GUIDE CHAIN

(71) Applicant: igus GmbH, Cologne (DE)

(72) Inventors: Richard Habering, Cologne (DE); Dominik Barten, Meckenheim (DE); Konstantin Schmer, Cologne (DE)

(73) Assignee: IGUS GMBH, Cologne (DE)

( * ) Notice: Subject to any disclaimer, the term of this patent is extended or adjusted under 35 U.S.C. 154(b) by 179 days.

(21) Appl. No.: 16/608,031

(22) PCT Filed: Apr. 24, 2018

(86) PCT No.: PCT/EP2018/060485
§ 371 (c)(1),
(2) Date: Oct. 24, 2019

(87) PCT Pub. No.: WO2018/197499
PCT Pub. Date: Nov. 1, 2018

(65) Prior Publication Data
US 2020/0056947 A1 Feb. 20, 2020

(30) Foreign Application Priority Data

Apr. 24, 2017 (DE) .................... 20 2017 102 410.5

(51) Int. Cl.
*G01L 1/04* (2006.01)
*F16G 13/16* (2006.01)
*G01R 31/28* (2006.01)

(52) U.S. Cl.
CPC ................ *G01L 1/04* (2013.01); *F16G 13/16* (2013.01); *G01R 31/2841* (2013.01)

(58) Field of Classification Search
CPC .. G01N 3/08; F16G 13/16; G01L 5/04; G01R 31/11
See application file for complete search history.

(56) References Cited

U.S. PATENT DOCUMENTS 4,565,099 A * 1/1986 Arnold .................... G01L 5/042
73/862.41
4,979,125 A * 12/1990 Kwun .................... B65H 63/06
702/35

(Continued)

FOREIGN PATENT DOCUMENTS

DE 20312266 8/2004
EP 1521015 4/2005

(Continued)

OTHER PUBLICATIONS

English translation of International Search Report from corresponding PCT Appln. No. PCT/EP2018/060485, dated Aug. 13, 2018.

(Continued)

*Primary Examiner* — Tran M. Tran
(74) *Attorney, Agent, or Firm* — Grossman, Tucker, Perreault & Pfleger, PLLC (57) ABSTRACT

A monitoring system for monitoring the condition of and energy guide chain and/or a cable guided in an energy guide chain. Energy guide chains are used for guiding cables, hoses or the like, between abase and a moving end displaceable along a travel path and, in so doing, form a mobile run connected to the moving end, a stationary run with a connection end for the base and a deflection arc between the two runs. A monitoring device with at least one sensing component arranged on the energy guide chain. The monitoring device evaluates a signal generated using the sensing component in order to monitor the occurrence of a fault condition during operation of the energy guide chain. The sensing component includes an electrical indicator conductor guided by the energy guide chain and extending along the greater part of the length of the mobile run. To monitor the condition of a cable and in this case includes two electrical indicator conductors guided by the energy guide chain, the (Continued)

one end of which is connected to the monitoring device and the other end of which is short-circuited.

14 Claims, 3 Drawing Sheets

(56) References Cited

U.S. PATENT DOCUMENTS

| | | | | |
|---|---|---|---|---|
| 5,750,900 | A * | 5/1998 | Hugentobler | G01L 1/255 |
| | | | | 73/597 |
| 5,898,298 | A * | 4/1999 | Brandsma | G01D 5/243 |
| | | | | 324/71.1 |
| 7,023,217 | B1 | 4/2006 | Wong | |
| 7,685,885 | B2 * | 3/2010 | Cowgill | G01N 3/04 |
| | | | | 73/828 |
| 8,931,350 | B2 * | 1/2015 | Mupdende | G01N 3/08 |
| | | | | 73/829 |
| 8,983,027 | B2 * | 3/2015 | Kuesel | B65G 43/02 |
| | | | | 378/57 |
| 9,809,389 | B2 * | 11/2017 | Pauli | G01L 1/04 |
| 9,920,815 | B2 | 3/2018 | Jaeker et al. | |
| 10,071,862 | B1 * | 9/2018 | Barry | G01L 5/04 |
| 10,175,124 | B2 | 1/2019 | Hermey et al. | |
| 10,654,656 | B2 * | 5/2020 | Mader | G01L 5/107 |
| 10,807,804 | B2 * | 10/2020 | Kulick, III | B65G 23/44 |
| 2003/0222654 | A1 * | 12/2003 | Furse | G01F 23/0069 |
| | | | | 324/543 |
| 2011/0024268 | A1 * | 2/2011 | Merten | E21F 13/066 |
| | | | | 198/810.01 |
| 2013/0204555 | A1 * | 8/2013 | Scheuschner | G01R 23/16 |
| | | | | 702/59 |
| 2015/0122047 | A1 * | 5/2015 | Riddall | G01L 5/103 |
| | | | | 73/828 |
| 2018/0080971 | A1 * | 3/2018 | Gariboldi | G01R 31/54 |

FOREIGN PATENT DOCUMENTS

| | | | |
|---|---|---|---|
| JP | 2009-052714 | 3/2009 | |
| WO | 2004/090375 | 10/2004 | |
| WO | WO-2004090375 A1 * | 10/2004 | ......... G01M 13/023 |
| WO | 2013/156607 | 10/2013 | |
| WO | 2015/118143 | 8/2015 | |

OTHER PUBLICATIONS

English translation of Written Opinion of the International Searching Authority from corresponding PCT Appln. No. PCT/EP2018/060485, dated Aug. 13, 2018.

* cited by examiner

SYSTEM FOR POSITION AND/OR LINE MONITORING IN AN ENERGY GUIDE CHAIN

FIELD

The invention relates in general to a system for position and/or line monitoring in an energy guide chain. The invention relates specifically to a monitoring system for an energy guide chain which serves in dynamic guidance of at least one line, such as for example a cable, hose or the like, between a base and a moving end movable relative thereto. A system of the type in question on the one hand comprises an energy guide chain which is displaceable along a travel path and, in so doing, forms in variable manner, depending on moving end position, a mobile run with a connection end for the moving end, a stationary run with a connection end for the base and a deflection arc. On the other hand, the system comprises a monitoring device with at least one sensing component arranged on the energy guide chain, wherein the monitoring device evaluates a signal generated using the sensing component in order to monitor the occurrence of a fault condition during operation of the energy guide chain.

BACKGROUND

Various systems of this type are already known. For example, patent applications WO 2004/090375 A1 and WO 2013/156607 A1 disclose systems with a force sensor between the moving end and the energy guide chain, in order to monitor whether the forces arising lie within a tolerance range.

Patent application WO 2015/118143 A1 discloses a system with a mechanically acting sensing component, which detects damage to the energy guide chain using a triggering cord. A similar system is known from JP 2009 052 714 A, wherein a break detection system with an optical fibre is proposed, i.e. a break can be detected on the basis of the quantity of light.

The above-stated systems have the drawback of in principle only detecting damage that has already occurred. They therefore in particular do not allow proactive or predictive maintenance.

A monitoring system capable of allowing condition-oriented maintenance was described in patent application EP 1 521 015 A2. Here, the degree of wear of the energy guide chain, for example wear-related abrasion on the narrow face of a chain link, is determined in locally defined manner for example using electromechanically acting wear elements. However, this system does not provide any information about the current position of the energy guide chain or about the condition of a guided line.

It is also already known to determine the expected service life of cables in energy guide chains using laboratory tests, on the basis of a characteristic increase in conductor resistance, which typically occurs only after many hundreds of thousands or millions of test cycles.

Finally, a monitoring system is already known in this connection from U.S. Pat. No. 7,023,217 B1 which allows detection of the wear condition of electrical conductors, in particular of ribbon cables, for example in a trailing cable installation. Here, a plurality of conductors of the ribbon cable are tested on the basis of complex circuitry with a relay multiplexer and a precision voltmeter. As a result of the complex circuitry and the proposed connection technology at the two connection ends of the energy guide chain, this solution is however not very suitable for use in practical or active operation of an energy guide chain.

SUMMARY

A first object of the present invention therefore consists in proposing a monitoring system suitable for ongoing operation which allows early identification of fault conditions and/or wear, in particular before a defect is able to cause downtime, such as for example a chain or line break. The monitoring system is intended in particular to allow proactive or predictive maintenance to reduce or completely avoid downtime. It is intended to have the simplest possible construction and not to impair operation to any appreciable extent.

It is further intended, according to a second aspect, to propose a system which provides information about the current spatial position of the energy guide chain. It is thereby intended in particular to protect the system from damage due to undesired climbing or rearing up.

It is intended, according to a third aspect, to propose a simple system which allows monitoring of the condition, in particular of the wear condition, of at least one line guided by the energy guide chain.

To achieve the above-stated first object, in a monitoring system of the type in question, according to the invention, for the sensing component to include an electrical indicator conductor guided by the energy guide chain and extending along the greater part of the length of the mobile run. Provision is in this case further made for the monitoring device to comprise a circuit which is connected to the indicator conductor in order to detect at least one electrical quantity on the basis of resp. using the indicator conductor, and for the monitoring device to comprise a preferably programmable evaluation unit, which compares the signal which is dependent on the detected quantity, for example directly or optionally after signal processing, with at least one prestored reference value or a tolerance range.

The evaluation unit in this respect allows application-specific modular adaptation of the monitoring device, even in the case of an unchanging detection circuit topology, for example by suitable programming of the evaluation functions and/or variable storage of the operating parameters in the evaluation unit. The evaluation unit in this respect also allows, inter alia, a system of modular construction with a plurality of circuit modules, which, depending on the desired monitoring aspect, are respectively of like construction and independent of the indicator conductor used, for example one circuit type for position monitoring and one circuit type for line monitoring. In addition, flexible consideration of various variables, such as application- and operating time-dependent parameters and environmental parameters, for example energy guide chain length, radius of curvature, cycle number, temperature etc. is simplified. The detection circuit and the evaluation unit may be integrated as modules in a common assembly, optionally also on a printed circuit board, or constructed spatially separately.

In particular, to carry out a true measurement or instrumental detection of the electrical quantity, it is advantageous for the circuit to comprise a measurement device connected on the input side to the indicator conductor so as to detect the electrical quantity, in particular an electrical parameter of the indicator conductor, by quantitative measurement and on the output side to provide a signal for the evaluation unit which is dependent thereon. The term measurement may here be understood in the sense of the definition in DIN standard DIN 1319.

In particular, however, it is not only in the case of instrumental detection that the evaluation unit may include an integrated logic circuit, such as for example a microcontroller or the like, with a reference value memory for evaluating the detected or measured quantities in relation to one or more reference values, for example a tolerance range. The measurement device may be of any desired embodiment, optionally wholly analogue, part analogue and part digital or purely digital. Due to the preferably programmable logic circuit, the evaluation unit may be modular and optionally adapted to the measurement circuit. The reference value memory may also be separate from the actual evaluation unit, for example if the latter interrogates the former as required, but is preferably part of the logic circuit.

The modular construction for example allows application-adapted resistance or impedance measurement, independently of the indicator conductor used. Since the absolute value depends inter alia on the total length of the indicator conductor, which is intended to extend at least along the greater part of the length of the mobile run, the expected measured values are heavily dependent on the application in which the energy guide chain is being used. Through ongoing resistance or impedance measurement, for example, impending failure of wires due to fatigue fracture in an electrical cable may be relatively reliably predicted, as demonstrated further below in relation to the third aspect. Unlike the proposal for example in U.S. Pat. No. 7,023,217 B1, it is however unnecessary with the proposed evaluation unit to provide a redundant inactive energy guide chain or line solely for reference purposes.

The at least one indicator conductor extends preferably at least over the greater part of the length of the energy guide chain, in particular over the entire part of the length of the energy guide chain which is displaceable during operation. The indicator conductor in this case preferably extends at least over the half of the length of the energy guide chain located close to the moving end or adjacent thereto, since this is where wear is generally greatest as a result of stress caused by tensile and shearing forces and atypical behaviour most frequently occurs there. The indicator conductor is in this case intended to extend at least over the critical portion of the length of the energy guide chain, typically the first third viewed from the moving end.

The electrical indicator conductor may be embodied separately, as an additional line, or preferably as a component part of a cable used in the application. The indicator conductor is in both cases preferably guided in the same way as an active line and in the energy guide chain, in particular right from one end of the energy guide chain to the other and optionally also in the form of a loop back again to the one end.

According to the independently claimed second aspect of the invention, a monitoring system is provided for position monitoring of an energy guide chain for example for monitoring climb in the to-and-fro motion of the energy guide chain. According to the invention, the system has as a sensing component at least one or more electrical indicator conductors guided by the energy guide chain and extending at least along the greater part of the length of the mobile run. In this case, the monitoring device likewise has a circuit connected to the indicator conductor, which circuit detects an electrical quantity on the basis of i.e. using the indicator conductor. In addition, the circuit includes a generator which generates a time-variant excitation signal, in particular an alternating current or pulse signal, which is fed into the indicator conductor or an additional conductor which electromagnetically, for example inductively, influences the indicator conductor.

In this way, the circuit may detect at the indicator conductor as quantity an electrical parameter which is geometry-sensitive in relation to the spatial position of the indicator conductor. In an electrodynamics context, the time-variable electromagnetic field induced by the generator brings about, when the arrangement is suitable, an interaction with the indicator conductor which is a function of the spatial position of the indicator conductor, i.e. also of the position of the energy guide chain. Thus, information may be obtained from the geometry-sensitive electrical parameter about the current position of the energy guide chain, in particular an abnormal course, such as for example undesired climbing or rearing up of the mobile run.

In such an embodiment, the indicator conductor may for example form a receiver coil, which is preferably displaceable with the mobile run. The detection circuit may then operate according to a metal detector principle. The circuit is preferably embodied, together with the receiving coil and optionally further coils in the manner of a BFO metal detector or a pulse induction metal detector, the construction of which is known per se to a person skilled in the art. Use of a VLF metal detector principle would also be conceivable, but this has a smaller range. An additional transmit coil, into which the generator feeds the excitation signal so as to generate a measurable signal in the indicator conductor, may in this case in particular be guided in the energy guide chain. This signal may then be detected as a quantity by the circuit and allow a conclusion to be drawn as to the spatial position of the indicator conductor.

These solutions are geometry-sensitive according to Maxwell's equations, for example on the one hand due to other electromagnetically active components in the environment of the energy guide chain (boundary conditions), but on the other hand also, for example, through the injection or feedback into the receiver coil, i.e. the indicator conductor, dependent on the current relative position and spatial position of the runs relative to one another (cf. mutual induction), through solid geometry-dependent self-induction and optionally also through the superimposition of the two above-stated position-dependent effects on the electromagnetic field.

Irrespective of the detection principle, provision may be made for the indicator conductor to form a coil and for the circuit to detect an inductive parameter. In this case, at least one coil, in particular the receiver coil and/or transmit coil, may extend in a portion of the length of the mobile run close to the moving end, in order to improve the last of the above-stated effects. Alternatively or in addition, the energy guide chain may also be guided in a ferromagnetic guide channel, which corresponds to the first of the above-mentioned effects on the quantity detectable at the indicator conductor.

There are various options, which may for example also relate to antenna technology, for detecting as quantity a parameter which is geometry-sensitive relative to the spatial position of the indicator conductor due to the electrodynamics.

Provision may for example be made for the indicator conductor to be arranged as a loop antenna, in particular in the energy guide chain, for the generator to feed the excitation signal into the indicator conductor and for the circuit to detect an antenna geometry-sensitive electrical parameter, for example a resonant frequency or the like, as quantity.

Alternatively, the indicator conductor may for example be arranged as a dipole antenna, in particular in the energy guide chain. As a result of the generator feeding the excitation signal into such an indicator conductor, the circuit may likewise detect an antenna geometry-sensitive electrical parameter as quantity, for example a standing wave ratio (SWR), a reflection factor or the like. Circuits suitable for this purpose, such as an SWR meter, a network analyser etc. are known per se.

In all the above-stated exemplary embodiments according to the second aspect, a quantity is detected which depends on the spatial position of the indicator conductor and thus also on at least one part of the energy guide chain. Information may thus be simply obtained about the current position or travel situation of the energy guide chain, in particular by comparing the quantity with a predetermined learned tolerance field.

According to a further, independent third aspect, a monitoring system for condition monitoring of a cable in an energy guide chain is proposed. This aspect may, however, optionally also be combined with a monitoring system according to the first and/or second aspect, inter alia since at least one indicator conductor is provided as core element.

According to the third aspect, a monitoring system is provided for monitoring the condition of a cable, which is guided in an energy guide chain between a base and a moving end movable relative thereto.

The independent third aspect proposes according to the invention, in a system that the sensing component includes two electrical indicator conductors guided by the energy guide chain, which indicator conductors extend along the greater part of the length of the mobile run or for example along the entire length, and that the monitoring device comprise a circuit with a measurement device for measuring resistance or conductance. The third aspect further provides that a proximal end point of each of the two indicator conductors respectively, i.e. the end points at one of the two connection ends of the energy guide chain, are connected to the measurement device and the respective other or distal end points of the two indicator conductors are short-circuited. These end points of the two indicator conductors may end at a specific lengthwise position of the energy guide chain or preferably at the other distal connection end of the energy guide chain. As a result of the short circuit, the conductors form a measurement loop, the resistance or conductance of which is measurable by the measurement device. One feasible example is a continuous measurement loop which is not interrupted by a separate short-circuit component, i.e. the one indicator conductor represents the outward distance or the proximal-to-distal distance and the other indicator conductor represents the return distance or vice versa. A separate short-circuit component is more practical, however, since it allows the use of existing multicore cables and does not require a continuous measurement loop.

The core concept is so-to-speak that the circuit comprises a measurement device for measuring a resistance or conductance of the indicator conductor and that the indicator conductor takes the form of a loop, such that measurement may be performed single-endedly at the same connection end of the energy guide chain. In addition, the outward and return course increases the measured resistance value and approximately doubles the wear-related effect, which simplifies reliable early identification prior to core or strand breakage.

In a preferred further development of the third aspect, provision is made for the monitoring device to comprise an evaluation unit which includes an integrated logic circuit and a reference value memory. The logic circuit may in this case receive an output signal from the measurement device and use it for comparison with at least one prestored reference value from the reference value memory.

The circuit or measurement device thereof may be configured as a four-wire system in particular for voltage measurement, similar to the principle of a Thomson bridge (also known as a Kelvin bridge), with a reference resistor incorporated in the four-wire system, a difference amplifier and an analogue-digital converter, in order to enable precise detection of even relatively small resistance values of an indicator line. Such a further development for example provides the or each measurement loop with its own separate instrumentation amplifier, which is connected on the input side to both end points of the indicator conductors, and on the output side to an analogue-digital converter, in particular an analogue-digital converter integrated into the logic circuit. A reference resistor is preferably connected in series to the measurement loop(s), wherein a constant-current source feeds a measurement current through the measurement loop(s) and optionally the reference resistor. Using the reference resistor, the voltage measurement may detect even a very small measurement loop resistance from the two indicator conductors sufficiently precisely using a four-wire system, similar to the principle of a Thomson bridge.

Preferably, the measurement loop formed by the two-part, outward and return indicator conductor is formed on the basis of two additional, dedicated or assigned measurement cores in an active multicore supply cable, the remaining cores of which serve the actual supply purpose, for example data transmission or power supply.

The dedicated measurement cores are preferably short-circuited by means of a short-circuit component at the moving end and are connected at the base end to the measurement device of the circuit, i.e. the circuit and optionally the evaluation unit may simply be arranged on the stationary part of the installation. The configuration of the wiring may optionally also be reversed if the circuit is provided at the moving end, which is appropriate in particular for an evaluation unit arranged on the displaceable machine part.

To monitor the condition of a cable, it is particularly advantageous for the measurement cores, which form the substantial part of the indicator conductors, to be twisted together or optionally braided with other active cores in a supply cable used in operation for its intended purpose. This makes detection as meaningful and close to reality as possible with regard to the wear of the active cores which are actually to be monitored. In this case, the measurement cores may in particular be of like construction to at least one operationally active core and twisted or braided in a similar manner thereto. The measurement cores may in particular be of like construction to the core most prone to wear. In the case of lines of large cross-section, it is also conceivable to embody the measurement cores with smaller conductor cross-sections and interpolate the condition of a thicker main core, in particular by means of the evaluation unit. The integrated logic circuit or, particularly preferably, the evaluation unit preferably has an operator input for inputting a resistance or conductance measured on start-up by the measurement device as reference value. This makes it simple even for the end users themselves to define the normal value for the original or wear-free condition of the measurement loop or the indicator conductors. In this way, the monitoring device is inherently programmed in an application-specific manner, without its being necessary to know for example the length of the energy guide chain or similar data.

It is advantageous, in particular in conjunction with the latter feature, for the evaluation unit to be programmed to trigger a warning signal when the resistance or conductance of the indicator conductor differs from the reference value by a predetermined amount, in particular an amount in the range from 15-25% of the reference value. Taking an empirically determined amount as threshold value, cable monitoring can be carried out if only the original normal value for resistance or conductance is known.

The following further developments are advantageous for all above aspects, i.e. also for position monitoring and/or line condition monitoring.

The evaluation unit preferably includes a memory for application data and comprises a logic circuit which evaluates the signal output by the circuit in dependence on stored application data. This construction for example allows nominal values or a tolerance field to be learnt. Reference data may thus, for example, be recorded in an initialisation process during normal movement, as intended, of a new energy guide chain with the circuit and stored in the evaluation unit. The application- and/or position-specific reference data may for example be obtained from a test laboratory and prestored in the evaluation unit or transmitted thereto.

In the latter case in particular, the evaluation unit may include an input via which the current position of the moving end is detected. This makes it possible to read out a currently valid position-dependent reference value from the memory, which is significant in particular for geometry-sensitive quantities.

The evaluation unit may comprise a communication interface, for example a WLAN interface, for connection to a higher-level system, for reading in or transmitting data, for example for initialisation, for maintenance purposes or for data collection on the manufacturer's premises.

It is advantageous, in particular for precise instrumental detection, for the monitoring device to include a temperature sensor for temperature normalisation. This may be provided, for example, as a component part of an evaluation unit of modular construction.

To increase modularity, the device may include as part of the circuit or of the evaluation unit a logic circuit, in particular a microcontroller, ASIC, DSP or the like, which digitally processes the detected electrical quantity, in particular for comparison with a reference value from a reference value memory. This is advantageous in particular if the circuit performs analogue detection of the electrical quantity.

In ongoing operation of the energy guide chain, the circuit may detect the electrical quantity continuously or in time-discrete manner at uniform or random intervals. In this respect, a filter, in particular an average or peak filter, is preferably provided in the circuit or the evaluation unit, in order to filter out irrelevant fluctuations owing for example to electromagnetic interference and the like.

The device may, in particular in the form of a module, be arranged stationarily on the base, wherein the indicator conductor is connected single-endedly to the circuit at the connection end for the base.

The basic principle of the monitoring system proposed here is suitable for ongoing operation, both for monitoring the spatial course of the energy guide chain in ongoing operation and for monitoring the condition of a data or power supply cable of an energy guide chain in continuous operation. The systems serve in particular in preventive maintenance and/or safety shutdown.

BRIEF DESCRIPTION OF THE DRAWINGS

Further advantageous features and effects of the invention are explained in greater detail below on the basis of a number of preferred exemplary embodiments and with reference to the appended drawings, in which.

DETAILED DESCRIPTION

In all the drawings, identical reference numerals denote features of an equivalent nature or with an equivalent effect. Repetition is avoided for the purpose of simplification.

FIGS. 1-7 show an energy guide chain, denoted overall as 1, with a flat, stationary run 1A, also known as the lower run when arranged horizontally, a mobile run 1B, also known as the upper run when arranged horizontally, and with a displaceable, approximately U-shaped deflection arc 1C, as a movable transition therebetween, which ensures a predefined radius of curvature. A "sliding", i.e. non-self-supporting energy guide chain 1 for long travel paths, typically of >3 m is shown here. With such energy guide chains 1, the mobile run 1B may slide or roll on the stationary run 1A. Per se known skids or casters are not shown. To protect the guided lines (not shown), the predefined radius of curvature of the deflection arc 1C is markedly greater than the contact spacing between the runs 1A, 1B. The invention is however in principle also suitable for self-supporting energy guide chains or vertical applications (not shown).

The end region of the stationary run 1A forms a first connection point for the energy guide chain 1 and is fastened to a base fixed relative to the surrounding environment, which forms the fixed point 2 of the energy guide chain 10. The end region of the mobile run 1B forms a second connection point for the energy guide chain 1 and is fastened at a moving end 4, which is mobile relative to the fixed point 2, namely to the moving part to be supplied, for example of an industrial machine or installation.

In a manner known per se, the moving end 4 moves in a forward and backward direction in accordance with the double-headed arrows in FIGS. 1-7 and in so doing respectively pulls and pushes the energy guide chain 1. In FIGS. 1-7, the moving end 4 and thus the position of the energy guide chain 10 are shown purely by way of example, as illustrative snapshots or instantaneous intermediate positions. The energy guide chain 1 is configured for virtually planar movement in the forward and backward directions, i.e. with runs 1A, 1B which remain parallel, and consists substantially of chain links (not shown in greater detail) which can be bent relative to one another for example about parallel pivot axes pivotable perpendicular to the plane of FIGS. 1-7. In all the embodiments, the energy guide chain 1 may be guided at the sides in a guide channel 5 shown schematically in greater detail in FIG. 1B.

Figure 1A:
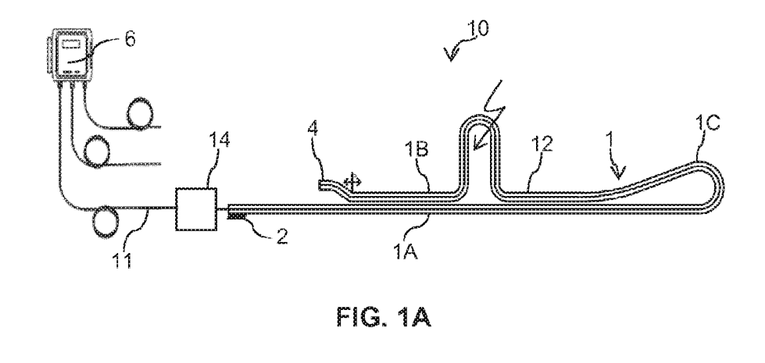
FIGS. 1A-1B: show schematic diagrams in side view (FIG. 1A) and schematic cross-section (FIG. 1B) of a first exemplary embodiment of a monitoring system according to one aspect.
Figure 2A:
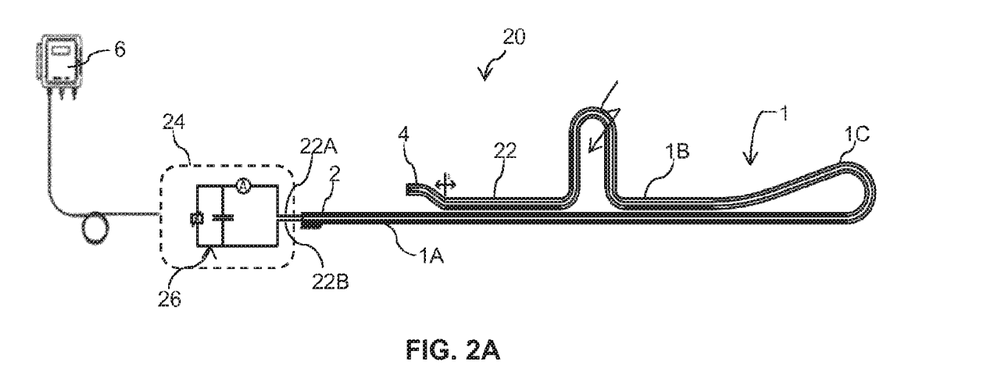
FIGS. 2A-2B: show schematic diagrams in side view (FIG. 2A) and schematic cross-section (FIG. 2B) of a second exemplary embodiment of a monitoring system according to one variant.
Figure 6A:
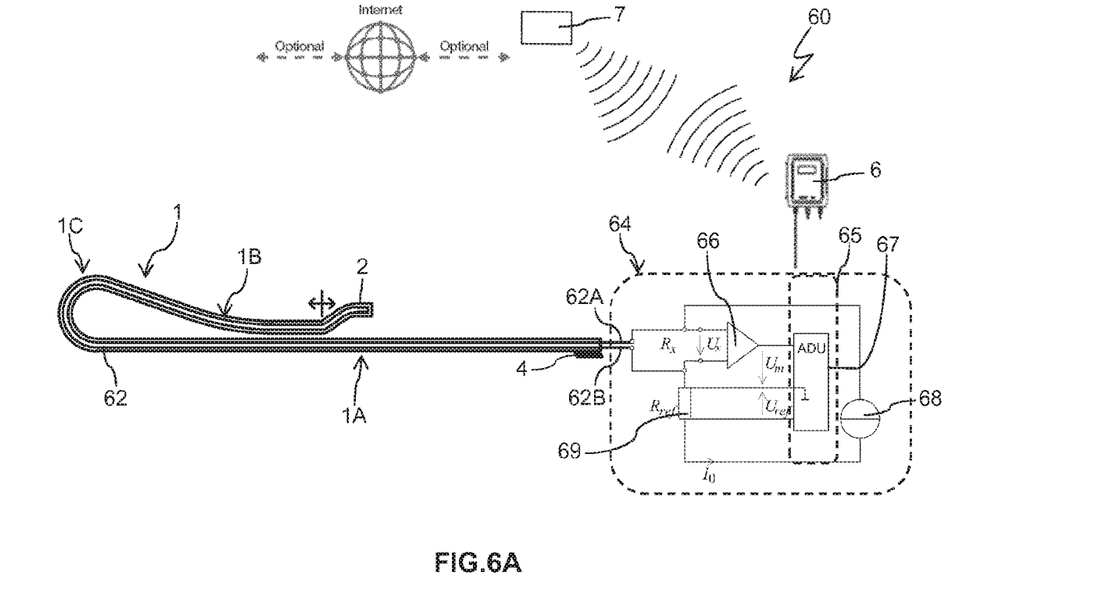
FIGS. 6A-6B: show schematic diagrams in side view (FIG. 6A) of an exemplary embodiment of a monitoring system according to a further aspect, with a wireless communication interface to a communication module, and as a separate circuit module (FIG. 6B) for monitoring the condition of a cable in an energy guide chain.

A fault condition (indicated as a "lightning bolt") involving a sub-region of the mobile run 1B climbing undesirably, which is unusual but possible particularly with long or fast-moving energy guide chains 1, is shown here purely schematically and exaggeratedly solely by FIG. 1A and FIG. 2A. FIG. 6A shows by way of example a normal course of the energy guide chain 1.

Figure 1B:
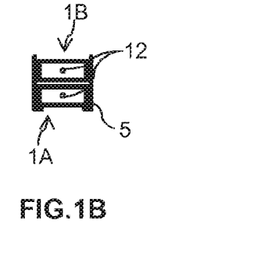

The exemplary embodiment according to FIGS. 1A-1B shows, as core elements of the sensing component, a monitoring system 10 with an electrical indicator conductor 12 guided along the two runs 1A, 1B and around the deflection arc 1C of the energy guide chain 1. The single indicator conductor 12 is arranged as a dipole or doublet antenna and connected solely at the final node on the base 2 to a circuit 14. The circuit 14 comprises a signal generator which feeds a high frequency excitation signal, for example an alternating current sine signal with a frequency of a few Mhz into the indicator conductor 12. The circuit 14 additionally has an SWR meter (not shown), which detects the standing wave ratio (SWR) as an electrical quantity by means of the indicator conductor 12. The SWR is dependent on the spatial position of the indicator conductor 12 and thus of the energy guide chain 1, in particular of the mobile run 1B. Detection of the SWR makes it possible to identify a fault condition (indicated as a "lightning bolt") by comparison with a setpoint SWR characteristic (cf. 30 in (FIG. 3)) learned during start-up. Instead of the SWR meter, a network analyser or a simpler circuit may for example also be suitable for measuring the reflected wave in the case of an unchanging excitation frequency. The circuit 14 is connected on the output side to an evaluation unit 6, which for example evaluates an output signal, indicating the SWR, of the circuit 14 and triggers an emergency stop in good time in the event of a fault condition.

Figure 2B:
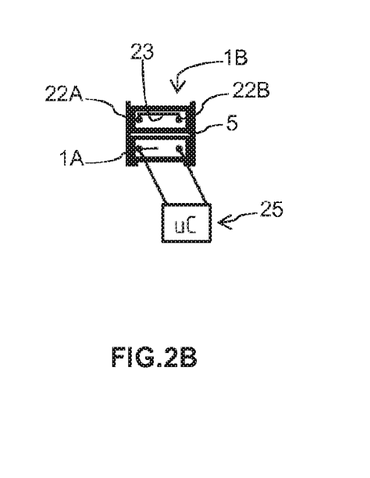

In the variant according to FIGS. 2A-2B, the indicator conductor 22 forms a measurement loop or loop antenna and is arranged in the circuit 24 as an inductive part of an RLC oscillating circuit. The two end points of two measurement cores 22A, 22B at the base 2 are connected directly to the remaining components of the oscillating circuit of the circuit 24. The distal end points, for example at the moving end 4, are short-circuited by means of a low-resistance short-circuit component 23, as shown in FIG. 2B. Since induction is here also geometry-dependent, the circuit 24 can identify a change in the coil induction of the measurement loop as measured value 30 in comparison with a normal characteristic between two tolerance curves 31, 32, as indicated schematically in FIG. 3. This may proceed by means of a microcontroller 25 as part of the circuit 24 or in the evaluation unit 6, for example by identifying an abnormal jump in the detected electrical quantity of the two-part indicator conductor 22.

Figure 4:
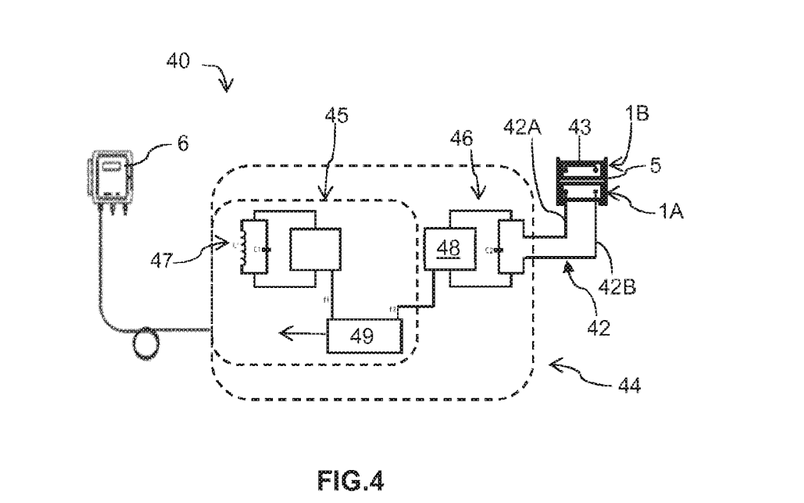
FIG. 4: shows a schematic diagram in side view of a third exemplary embodiment of a monitoring system.

FIG. 4 shows a variant of the monitoring system 40 consisting of two oscillating circuits for detecting an unexpected change in beat frequency by superimposition. The indicator conductor 42 here also forms a loop or coil of two measurement cores 42A, 42B, which are also guided from the base 2 to the moving end 4 in the energy guide chain and are bridged at the moving end by the short-circuit component 43.

The circuit forms a first measuring oscillating circuit 46, with a capacitor (C2) and the measurement loop 42 as inductor, to which a sine signal is applied by a signal generator 48. As a function of a measurement run or teaching on start-up, a reference oscillating circuit 47 simulates the normal behaviour of the measuring oscillating circuit 46 when the energy guide chain 1 is running as intended, wherein the behaviour thereof is dependent on the position of the moving end 4. Simulation may be achieved for example by an input measured value sequence or an adjustable oscillator in a microcontroller 45. By means of a mixer stage 49, a beat frequency is then generated on the basis of the oscillation detected at the measuring oscillating circuit 46 and the position-dependently simulated oscillation of the reference oscillating circuit 47. The beat frequency generated or simulated by the mixer stage 49 is then compared for example with a tolerance field 31, 32 dependent on the position X of the moving end 4, as shown schematically in FIG. 3. This variant for example follows the principle of a metal detector, and may in particular be used with a guide channel 5 of ferromagnetic sheet steel or the like.

In a variant not shown in any greater detail, a separate excitation or transmit coil may also be provided together with the measurement loop consisting of the measurement cores 42A, 42B, for example according to the principles of other metal detector types.

Figure 5:
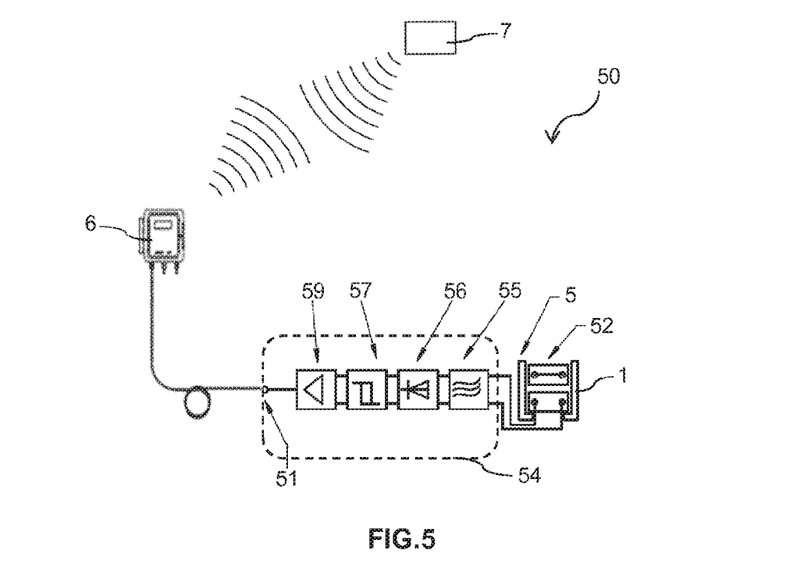
FIG. 5: shows a schematic diagram in side view of a fourth exemplary embodiment of a monitoring system according to a further variant, with a wireless communication interface to a communication module.

FIG. 5 shows a further, inductively detecting monitoring system 50, wherein the guide channel 5 acts in a similar manner to a "ferrite core". The loop-shaped indicator conductor 52 is excited by an oscillator 55 as signal generator and measured. A demodulator 56 leads the detected signal to a discriminator or hysteresis comparator 57, and onward to an output stage, which provides an output signal 51 for the evaluation unit 6. Learned normal values or tolerance curves 31, 32 may here be input into the evaluation unit 6 on start-up or via a data link such as for example WLAN with a communication module 7.

The above-described monitoring systems 10, 30, 40, 50 allow, in particular on the basis of electromagnetic interaction, the identification of a deviation in the position of the energy guide chain 1 from its nominal setpoint course.

Figure 6B:
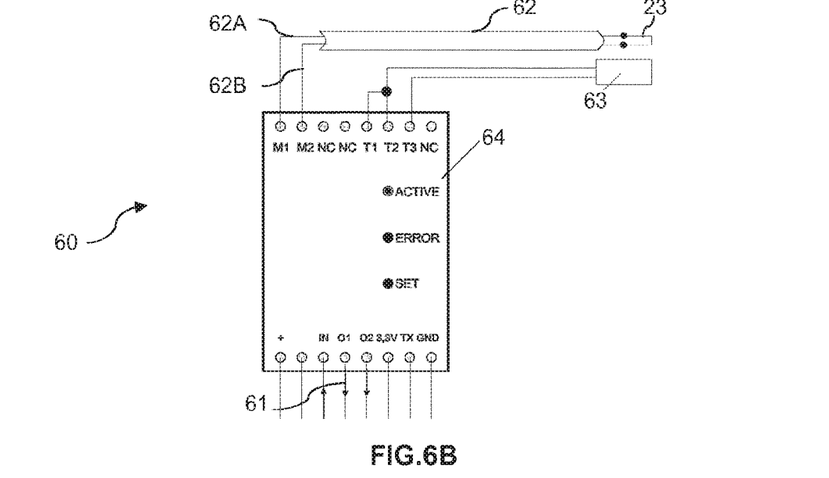

A further, independent aspect is described below, namely a system 60 for wear monitoring of electrical conductors or cores in a supply cable of an active energy guide chain to provide early warning of an impending cable break.

The circuit module 64 has two status indicators for example (ACTIVE, ERROR: FIG. 6B) and a button (SET: FIG. 6B) for inputting a nominal resistance value into a memory register in a microcontroller 65 of the circuit module 64.

An instrumentation or difference amplifier (OpAmp) 66 is connected directly to the final nodes of two measurement cores 62A, 62B, which form a loop-shaped indicator conductor 62 in the energy guide chain 1, which is short-circuited at the moving end 4 via a component 23. The output of the instrumentation amplifier 66 is connected to the input of an A/D converter 67 in the microcontroller 65 converter, which taps a voltage of a reference resistor 69 at two further inputs. The series-connected measurement cores 62A, 62B are connected in series to the reference resistor 69 (Rref) and are supplied with a constant current by a reference direct current source 68 (constant-current source) of the circuit module 64 (I0). The inputs of the ADC 67 detect on the one hand the measurement voltage dropping across the measurement loop 62A, 62B in order to determine the relatively low ohmic series resistance Rx thereof by means of the current (I0) and on the other hand, according to the four-wire measurement principle, the voltage at the reference resistor 69 (Rref), from the ratio of which the resistance Rx to be measured is determined precisely with the microcontroller 65.

To increase detection reliability, a plurality of measurement loops 62A, 62B may also be measured in each case via their own difference amplifier 66 and corresponding input of the ADC 67. As an alternative to the resistance, a conductance may naturally also equally well be determined. The measuring line, i.e. a respective proximal final node of the measurement cores 62A, 62B close to the base 2, is connected to terminals M1 and M2 (FIG. 6B) of the circuit module 64. The two distal final nodes of measurement cores 62A, 62B are short-circuited or connected together with low resistance. For normalisation purposes, a temperature sensor 63 is connected to the circuit module 64 (terminals T2 and T3).

The microcontroller 65 causes the ACTIVE LED to light up green as soon as the circuit module 64 is connected (via the + and − terminals) to a voltage supply (for example 24 V DC) and the reference value is input. On start-up, the reference value is programmed into the microcontroller 65 on a one-off basis by actuating the SET button, by initial measurement via the instrumentation amplifier 66 as above.

The green and red ERROR LEDs light up as soon as the resistance Rx of the line measured by the microcontroller 65 has exceeded a predetermined warning threshold value (for example 1.25×Rx). The warning threshold value may be empirically determined from life tests and optionally also subsequently changed or updated, for example via the communication module 7. Furthermore, the microcontroller 65 may close a warning signal contact (O1) via an output by a relay (not shown).

If a cable break has occurred (Rx tending towards infinity), the green LED goes out, for example, leaving only the red ERROR LED lit up. In addition, the microcontroller 65 then closes a further potential-free fault contact (O2).

The warning signal is preferably transmitted via a communication interface, for example an industrial bus, RS-232 or the like (3.3 V, T, GND) to the here optional evaluation unit 6 or directly to an internet-capable communication module 7.

Via the communication interface (3.3 V, TX, GND) of the circuit module 64, the microcontroller 65 may transmit detected measurement data (resistance, constant current, voltage drop, temperature etc.) to the optional evaluation unit 6 or directly to the communication module 7. The circuit module 64 may alternatively or additionally include a data logger (for example a Micro SD card) for storing measured data. In addition, sensor inputs may be provided as a cycle counter or for position detection (for example according to FIGS. 1-5). When programming the microcontroller 65, a software filter may be provided for filtering out disruptive influences caused for example by electromagnetic interaction with other active lines. The resistance of the measurement cores 62A, 62B may be measured periodically, for example with a spacing of a few minutes, or at quasi-random time intervals, to avoid artefacts caused for example by harmonics and the like.

Figure 7:
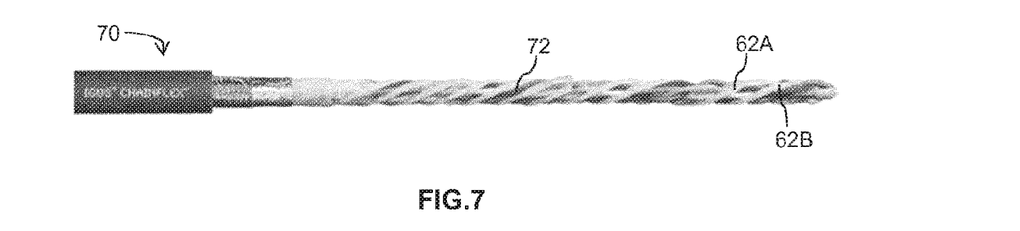
FIG. 7: shows a photo of a partly stripped electrical supply cable with twisted cores.

FIG. 7 shows purely by way of example and for illustrative purposes how measurement cores 62A, 62B are twisted together with active supply cores in a supply cable 70, wherein the measurement cores 62A, 62B are of like construction to at least other operationally active supply cores.

LIST OF REFERENCE NUMERALS

Figure 3:
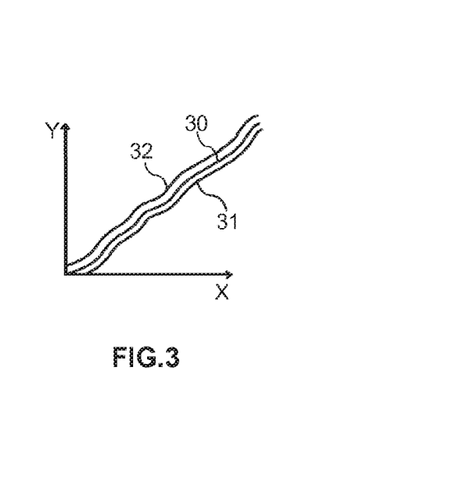
FIG. 3: shows a diagram of a tolerance field within which an electrical quantity at the indicator conductor should lie.

FIGS. 1-6
1 Energy guide chain
1A Stationary run
1B Mobile run
1C Deflection arc
2 Fixed point
4 Moving end
5 Guide channel
6 Evaluation unit
7 Communication module
FIGS. 1A-1B
10 Monitoring system
11 Signal
12 Indicator conductor
14 Circuit
FIGS. 2A-2B
20 Monitoring system
22 Indicator conductor
22A, 22B Measurement cores
23 Short-circuit component
24 Circuit
25 Microcontroller
26 Oscillating circuit
FIG. 3
X Position of moving end
Y Amount (of the electrical quantity)
30 Measured value (of the electrical quantity)
31 Lower tolerance curve
32 Upper tolerance curve
FIG. 4
40 Monitoring system
42 Indicator conductor
42A, 42B Measurement cores
43 Short-circuit component
44 Circuit
45 Microcontroller
46 Measuring oscillating circuit
47 Reference oscillating circuit (simulated)
48 Signal generator
49 Mixer stage
FIG. 5
50 Monitoring system
51 Signal
52 Indicator conductor
54 Circuit
55 Oscillator (signal generator)
56 Demodulator
57 Comparator
59 Output stage
FIG. 6
60 Monitoring system
61 Signal
62 Indicator conductor (Rx)
62A, 62B Measurement cores
63 Temperature sensor
64 Circuit module
65 Microcontroller
66 Difference amplifier
67 A/D converter
68 Current source
69 Reference resistor (Rref)

FIG. 7
70 Electrical supply cable
72 Active cores
62A, 62B Measurement cores

What is claimed is:

1. A monitoring system for position monitoring of an energy guide chain for guiding at least one line between a base and a moving end movable relative thereto, comprising:
    an energy guide chain which is displaceable along a travel path and, in so doing, forms a first run with a connection end for the moving end, a second run with a connection end for the base and a deflection arc between the two runs, and
    a monitoring device with at least one sensing component arranged on the energy guide chain, which monitoring device evaluates a signal generated using the sensing component in order to monitor occurrence of a fault condition during operation of the energy guide chain,
    wherein the sensing component includes an electrical indicator conductor guided by the energy guide chain and extending at least along a greater part of a length of the first run, and
    wherein the monitoring device comprises a circuit electrically connected to the indicator conductor, wherein the circuit detects an electrical quantity using the indicator conductor and includes a generator which generates a time-varying excitation signal for creating a time-varying electromagnetic field that causes electromagnetic interaction with the indicator conductor, the electromagnetic interaction being a function of a spatial position of the indicator conductor, wherein the electrical quantity which the circuit detects is an electrical parameter which is geometry-sensitive in relation to the spatial position of the indicator conductor.

2. The monitoring system according to claim 1, wherein the indicator conductor forms a receiver coil and the circuit operates according to a BFO metal detector principle or according to a pulse induction metal detector principle or according to a VLF metal detector principle.

3. The monitoring system according to claim 2, wherein an additional transmit coil, into which the generator feeds the excitation signal, is guided in the energy guide chain.

4. The monitoring system according to claim 1, wherein the indicator conductor forms at least one coil and in that the circuit detects an inductive parameter, wherein
    the at least one coil extends in a portion of the length of the first run, and/or
    the energy guide chain is guided in a ferromagnetic guide channel.

5. The monitoring system according to claim 1, wherein the indicator conductor is arranged as a loop antenna, wherein the generator feeds the excitation signal into the indicator conductor and wherein the electrical parameter is sensitive in relation to a geometry of the loop antenna.

6. The monitoring system according to claim 1, wherein the indicator conductor is arranged as a dipole antenna, wherein the generator feeds the excitation signal into the indicator conductor and wherein the electrical parameter is sensitive in relation to a geometry of the dipole antenna.

7. The monitoring system according to claim 1, wherein the monitoring device comprises an evaluation unit connected to the circuit, wherein the circuit provides a signal which is dependent on the electrical quantity, and the evaluation unit uses the signal for comparison with at least one prestored reference value, wherein the evaluation unit includes a memory for application data and comprises a logic circuit which evaluates the signal output by the circuit in dependence on stored application data.

8. The monitoring system according to claim 1, wherein the monitoring device comprises an evaluation unit connected to the circuit, wherein the circuit provides a signal which is dependent on the electrical quantity, and the evaluation unit uses the signal for comparison with at least one prestored reference value, wherein the evaluation unit comprises a communication interface for connection to a higher-level system.

9. The monitoring system according to claim 1, wherein the monitoring device includes a temperature sensor for temperature normalisation.

10. The monitoring system according to claim 1, wherein a logic circuit is provided, which digitally processes the detected electrical quantity for comparison with a reference value from a reference value memory.

11. The monitoring system according to claim 1, wherein the monitoring device comprises an evaluation unit connected to the circuit, wherein the circuit provides a signal which is dependent on the electrical quantity, and the evaluation unit uses the signal for comparison with at least one prestored reference value, wherein, in ongoing operation of the energy guide chain, the circuit detects the electrical quantity continuously or in time-discrete manner, and a filter is provided in the circuit or the evaluation unit.

12. The monitoring system according to claim 1, wherein the monitoring device is arranged as a module stationarily on the base and the indicator conductor is connected single-endedly to the circuit at the connection end for the base.

13. The monitoring system according to claim 1, wherein the monitoring system is configured to monitor a spatial course of the energy guide chain in ongoing operation.

14. The monitoring system according to claim 1, wherein the first run is a mobile run and the second run is a stationary run.

* * * * *